United States Patent
Choi et al.

(10) Patent No.: US 6,291,850 B1
(45) Date of Patent: Sep. 18, 2001

(54) STRUCTURE OF CYLINDRICAL CAPACITOR ELECTRODE WITH LAYER OF HEMISPHERICAL GRAIN SILICON

(75) Inventors: Byung Jae Choi; Kwan Goo Rha; Hong Seok Kim; Jae Young An, all of Chungcheongbuk-do (KR)

(73) Assignee: Hyundai Electric Industries Co., Ltd., Kyoungki-do (FR)

( * ) Notice: Subject to any disclaimer, the term of this patent is extended or adjusted under 35 U.S.C. 154(b) by 0 days.

(21) Appl. No.: 09/435,366

(22) Filed: Nov. 8, 1999

(30) Foreign Application Priority Data

Dec. 23, 1998 (KR) ................................. 98-57883

(51) Int. Cl.[7] .................................. H01L 27/108
(52) U.S. Cl. ................................ 257/309; 257/306
(58) Field of Search ........................... 257/309, 308, 257/307, 306, 300; 438/253

(56) References Cited

U.S. PATENT DOCUMENTS

| | | | |
|---|---|---|---|
| 5,545,582 | * 8/1996 | Roh | 437/52 |
| 5,665,625 | * 9/1997 | Sandhu et al. | 438/396 |
| 5,736,450 | * 4/1998 | Huang et al. | 438/396 |
| 5,759,895 | * 6/1998 | Tseng | 438/255 |
| 5,831,282 | * 11/1998 | Nuttall | 257/64 |
| 5,858,834 | * 1/1999 | Hirota et al. | 438/253 |
| 5,923,973 | * 7/1999 | Chen et al. | 438/255 |
| 5,962,886 | * 10/1999 | Mori et al. | 257/309 |
| 6,093,617 | * 7/2000 | Su et al. | 438/398 |
| 6,143,605 | * 11/2000 | Lou | 438/255 |

* cited by examiner

Primary Examiner—Steven Loke
Assistant Examiner—Douglas W. Owens
(74) Attorney, Agent, or Firm—Morgan, Lewis & Bockius LLP

(57) ABSTRACT

A structure of a lower electrode of a capacitor includes a first lower electrode, second lower electrodes formed at both sides of the first lower electrode and electrically connected to and higher than the first lower electrode, and a Hemispherical Grain-Silicon (HSG-Si) layer formed on a top surface of the first lower electrode and inside walls of the second lower electrodes.

15 Claims, 9 Drawing Sheets

STRUCTURE OF CYLINDRICAL CAPACITOR ELECTRODE WITH LAYER OF HEMISPHERICAL GRAIN SILICON

This application claims the benefit of Korean Patent Application No. 57883/1988, filed Dec. 23, 1998, which is hereby incorporated by reference.

BACKGROUND OF THE INVENTION

1. Field of the Invention

The present invention relates to a capacitor in a dynamic random access memory (DRAM), and more particularly, to a structure of a lower electrode of a capacitor which inhibits occurrence of bridges between nodes, and to a method for fabricating the same.

2. Background of the Related Art

As a semiconductor memories have developed from millions of transistors on a single chip to billions of transistors on a single chip, a number of methods have been employed to increase an effective area of a capacitor within a restricted area of a cell in the semiconductor memory. For example, the effective area of the capacitor is increased by forming a three dimensional storage node, such as a trench type or a cylinder type. Further, a surface of a storage electrode used as a lower electrode of the capacitor is formed of HSG-Si (Hemispherical Grain-Silicon) that has a rough morphology rather than a smooth morphology, thereby increasing the effective area of the capacitor. Moreover, the three dimensional storage node approach and the HSG-Si approach can be combined.

The combined approach to increase the effective area of the capacitor will now be explained with reference to FIGS. 1A–1D. FIGS. 1A–1D illustrate cross-sections each showing a lower electrode of a capacitor (of a cylinder type) with an HSG-Si applied to it.

Referring to FIG. 1A, an interlayer insulating film 3 is deposited on a semiconductor substrate 1 having an impurity region 2 formed therein. Then, a portion of the interlayer insulating film 3 over the impurity region 2 is selectively removed, to form a contact hole for a capacitor storage electrode. Next, an amorphous silicon layer 4 is deposited. Preferably, the amorphous silicon layer 4 is formed of an amorphous silicon doped with phosphorus at a concentration of approximately $2.0 \times 10^{20}$ atoms/cm$^3$.

As shown in FIG. 1B, an oxide film 5 is deposited on an entire surface of the device, and photoetched to selectively remove portions of the oxide film 5, leaving the patterned oxide film 5 in a region around the contact hole. Then, the patterned oxide film 5 is used as a mask to selectively remove the amorphous silicon layer 4. An amorphous silicon layer is deposited on an entire surface of the device and anisotropically etched to form amorphous silicon sidewalls 6 at sides of the patterned oxide film 5. The amorphous silicon sidewalls 6 and the amorphous silicon layer 4 are electrically connected.

As shown in FIG. 1C, all of the oxide film 5 is removed, thereby forming lower electrode 7 of a cylindrical capacitor. As shown in FIG. 1D, silicon seeds are formed on a surface of the lower electrode 7 using a seeding gas (such as $Si_2H_6$ or $SiH_4$) at approximately 570–620° C. in an HSG-Si forming apparatus, and then annealed, to form an HSG-Si layer 8 with a rough surface. Thus, a cylindrical lower electrode 7 with an HSG-Si "mushroom" structure can be formed. Though not shown in these figures, by forming a dielectric film and an upper electrode in succession on the cylindrical lower electrode 7, the capacitor is completed.

However, the capacitor and the method for fabricating the capacitor for a DRAM as described above has a number of problems. For example, with a gap below 0.2 μm between storage nodes of capacitors in the semiconductor memory with a high device packing density, and with the HSG-Si formed on a three dimensional structure like the cylindrical structure, the HSG-Si can fall off from regions with lower adhesive forces and subsequently remain between the storage nodes, without being removed even by a cleaning process. Thus, the HSG-Si can create bridges that cause electrical shorts between the nodes, mostly by the HSG-Si that has fallen off from peak points (end points in the cylindrical form) in the lower electrode. That is, the weak connection of a neck portion of the HSG-Si "mushroom" structure (resulting from a lack of the amorphous silicon required for formation of the HSG-Si due to a relatively thin amorphous silicon at the peak point) causes the fall-off or hang-down that formed bridges between adjacent nodes. Also, the HSG-Si connected to an external surface of the lower electrode can fall-off or hang-down in the course of cleaning or a high temperature annealing process, thereby causing bridges between adjacent nodes.

SUMMARY OF THE INVENTION

Accordingly, the present invention is directed to a structure of a lower electrode of a capacitor and a method for fabricating the same that substantially obviates one or more of the problems due to the limitations and disadvantages of the related art.

An object of the present invention is to provide a structure of a lower electrode of a capacitor and a method for fabricating the same which can inhibit occurrence of bridges.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in a first aspect of the present invention there is provided a structure of a lower electrode of a capacitor including a first lower electrode, second lower electrodes formed at both sides of the first lower electrode and electrically connected to and higher than the first lower electrode, and a Hemispherical Grain-Silicon (HSG-Si) layer formed on a top surface of the first lower electrode and inside walls of the second lower electrodes.

In another aspect of the present invention, there is provided a method for fabricating a capacitor comprising the steps of forming an interlayer insulating film on a semiconductor substrate, removing a portion of the interlayer insulating film to define a capacitor region, depositing a first thin semiconductor layer and a second thin semiconductor layer, depositing a planarizing insulating film on the second thin semiconductor layer, etching back the planarizing insulating film, and the first and second thin semiconductor layers until a surface of the interlayer insulating film is exposed, removing the planarizing insulating film and the interlayer insulating film to form a lower electrode, and forming a HSG-Si (Hemtispherical Grain-Silicon) layer on a surface of the second thin semiconductor layer.

In another aspect of the present invention, there is provided a method for fabricating a capacitor comprising the steps of forming an interlayer insulating film on a semiconductor substrate and having a contact hole, depositing a conductive layer and a planarizing insulating film on the interlayer insulating film and the contact hole, selectively removing the conductive layer and the planarizing insulating film to leave the conductive layer and the planarizing insulating film only in a capacitor-forming region, forming first semiconductor sidewalls at sides of the planarizing insulating film and connected to the conductive layer, forming second semiconductor sidewalls at sides of the first semiconductor sidewalls, removing the planarizing insulating film, and forming a HSG-Si (Hemispherical Grain-Silicon) layer on surfaces of the first semiconductor sidewalls.

In another aspect of the present invention, there is provided a lower electrode of a capacitor including a dielectric layer on a cylindrical lower electrode, and an upper electrode on the dielectric layer, the cylindrical lower electrode including a first bottom portion in contact with the plug, a second bottom portion on the first bottom portion and having different characteristics from the first bottom portion, a cylinder wall having the same material as the second bottom portion on its inner side, and the same material as the first bottom portion on its outer side, and a layer of HSG-Si (Hemispherical Grain-Silicon) formed on the inner side of the cylinder wall and the second bottom portion.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1A:
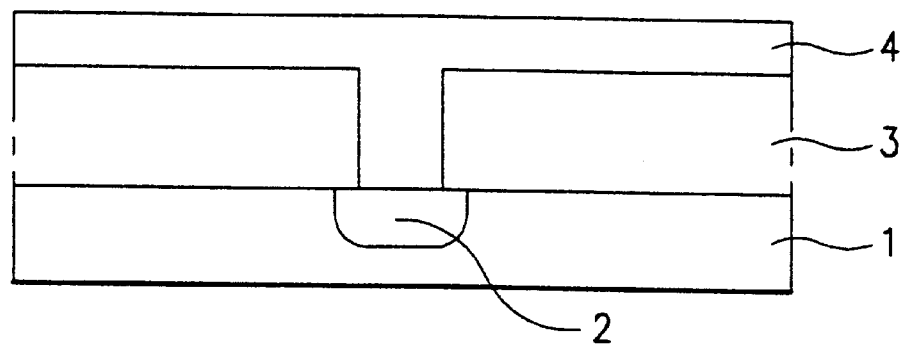
FIGS. 1A–1D illustrate cross-sections showing steps of a related art method for fabricating a lower electrode of a capacitor.
Figure 1B:
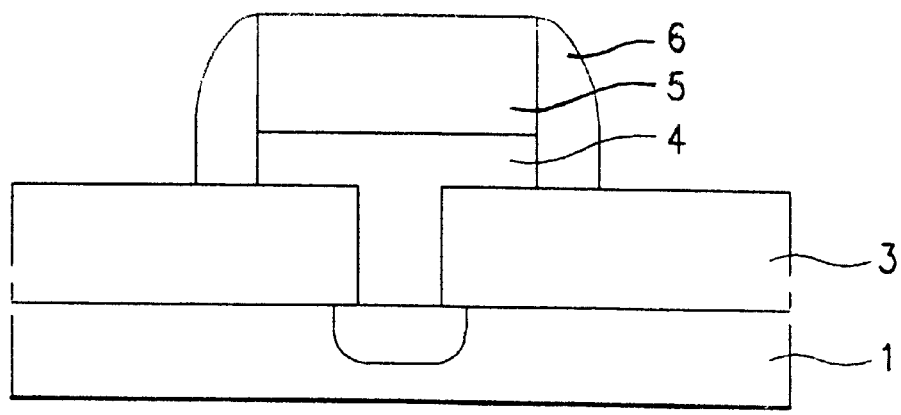
Figure 1C:
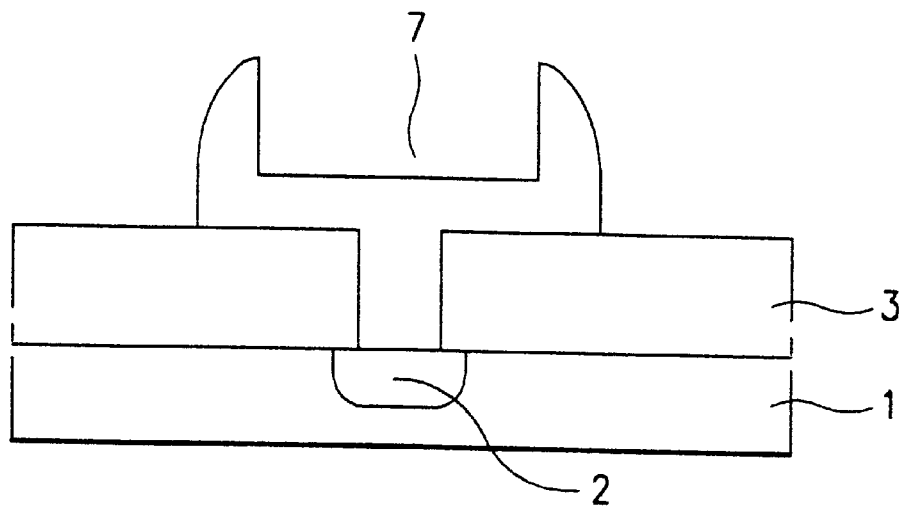
Figure 1D:
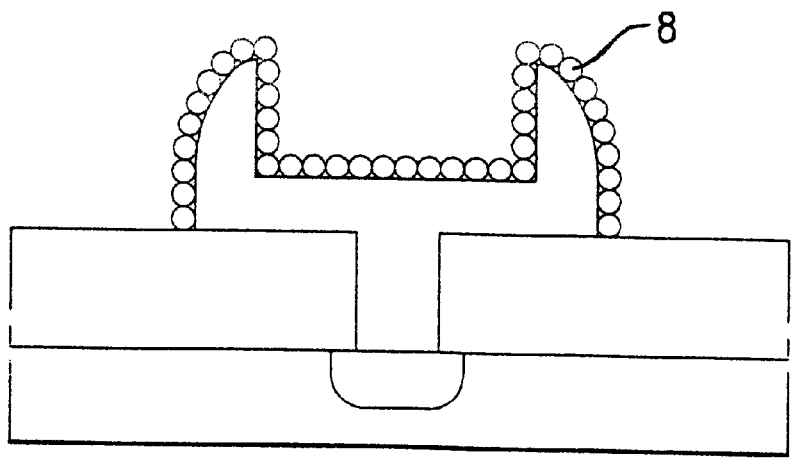
Figure 2A:
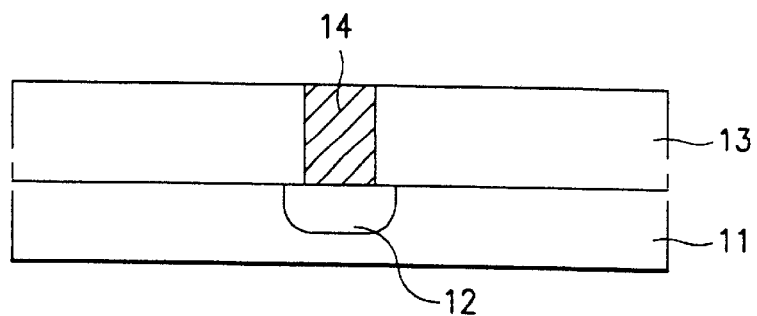
FIGS. 2A–2F illustrate cross-sections showing steps of a method for fabricating a lower electrode of a capacitor in accordance with a first preferred embodiment of the present invention.

Referring to FIG. 2A, a first interlayer insulating film 13, such as an oxide film, is deposited on a semiconductor substrate 11 that has in impurity region 12 formed therein. A portion of the interlayer insulating film 13 over the impurity region 12 is selectively removed to form a contact hole for a capacitor storage node. Polysilicon or metal is deposited on an entire surface of the device and etched back to expose a surface of the first interlayer insulating film 13, to form a plug 14 in the contact hole.

Figure 2B:
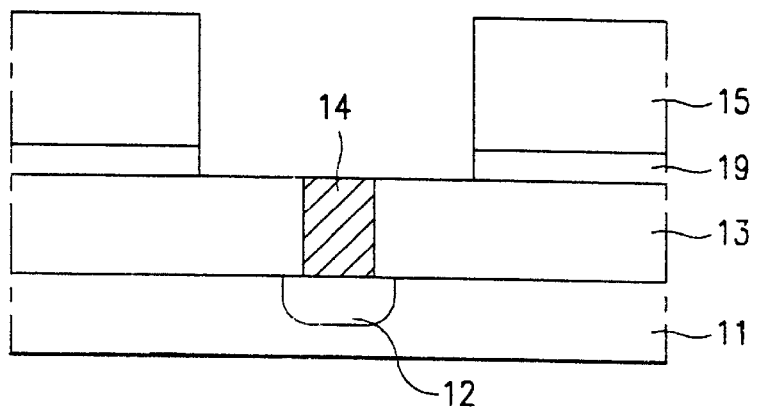

As shown in FIG. 2B, a nitride film 19 and a second interlayer insulating film 15, such as an oxide film, are formed, and a capacitor formation region is defined therein. The nitride film 19 and the second interlayer insulating film 15 in the capacitor formation region are selectively removed. The nitride film 19 and the second interlayer insulating film 15 should be thick enough for capacitor formation since the thicknesses are related to a capacitance of the capacitor.

Figure 2C:
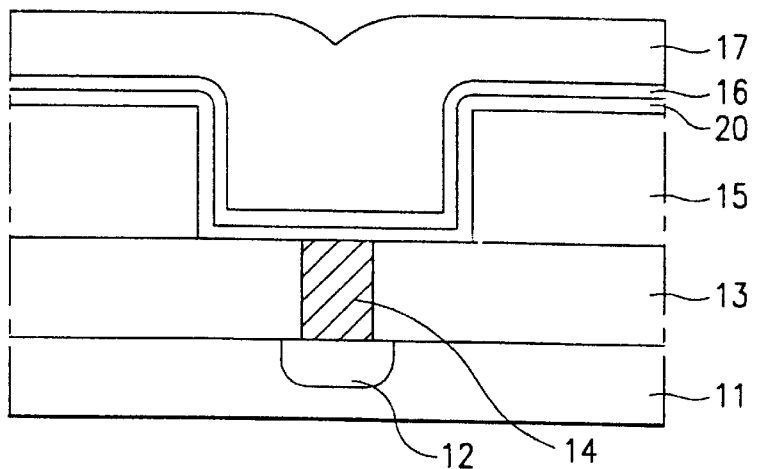

As shown in FIG. 2C, a thin polysilicon layer 20 is deposited on an entire surface preferably at a temperature of at least 560° C. A thin amorphous silicon layer 16 is deposited on the thin polysilicon layer 20 at a temperature below 530° C. Then, a planarizing insulating film 17, such as an SOG (Silicon On Glass), is deposited on the amorphous silicon layer 16. The amorphous silicon layer 16 is formed of amorphous silicon doped with phosphorus at a concentration of approximately $2.0 \times 10^{20}$ atoms/cm$^3$.

Figure 2D:
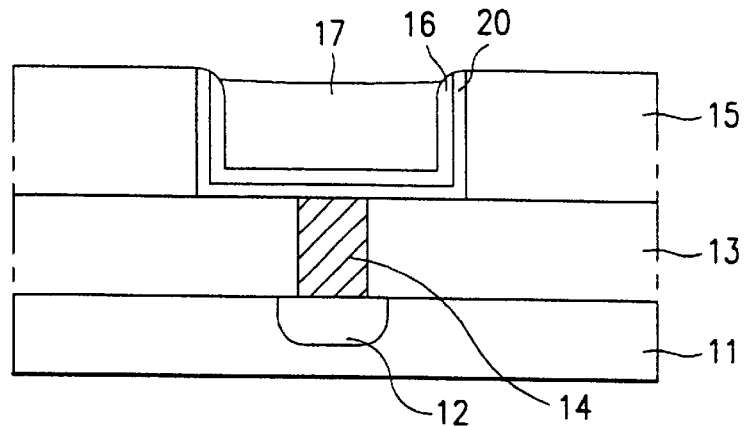

As shown in FIG. 2D, the planarizing insulating film 17, the amorphous silicon layer 16, and the polysilicon layer 20 are etched back until a surface of the second interlayer insulating film 15 is exposed.

Figure 2E:
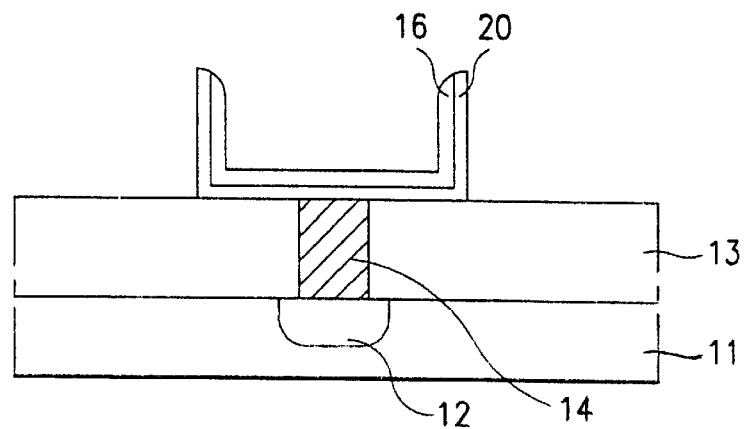

As shown in FIG. 2E, all of the planarizing insulating film 17 and the second interlayer insulating film 15 are wet etched to form a lower electrode of the capacitor.

Figure 2F:
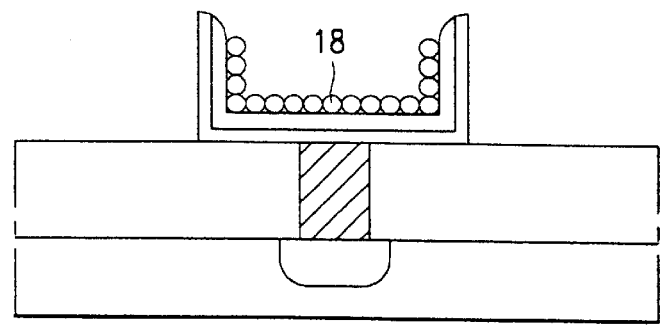

As shown in FIG. 2F, silicon seeds are formed on a surface of the amorphous silicon layer 16 in the lower electrode at approximately 570–620° C. using a seeding gas ($Si_2H_6$ or $SiH_4$) in an HSG-Si forming apparatus, and annealed to form an HSG-Si layer 18 with a rough surface. Here, the HSG-Si 18 is formed on a portion other than the polysilicon layer (an outside surface of the lower electrode). Then, a dielectric film and an upper electrode (not shown) are formed on the lower electrode in succession, to complete a capacitor.

A method for fabricating a capacitor in accordance with another embodiment of the present invention will now be explained with reference to FIGS. 3A–3F.

Figure 3A:
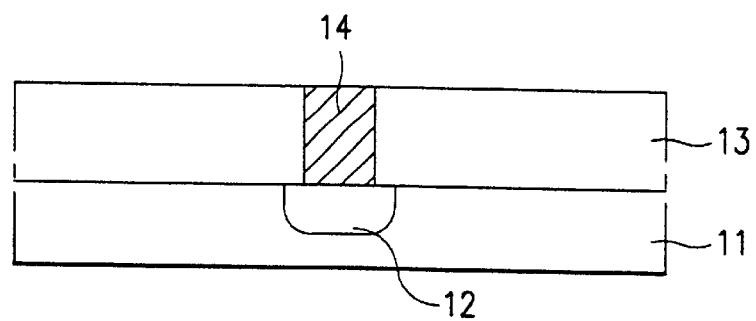
FIGS. 3A–3F illustrate cross-sections showing steps of a method for fabricating a lower electrode of a capacitor in accordance with a second preferred embodiment of the present invention.

Referring to FIG. 3A, a first interlayer insulating film 13 is deposited on a semiconductor substrate 11 having an impurity region 12 formed therein, and a portion of the first interlayer insulating film 13 over the impurity region 12 is selectively removed to form a contact hole for a capacitor storage electrode. Polysilicon or metal is deposited on an entire surface of the device and etched back to expose a surface of the first interlayer insulating film 13 to form a plug 14 in the contact hole.

Figure 3B:
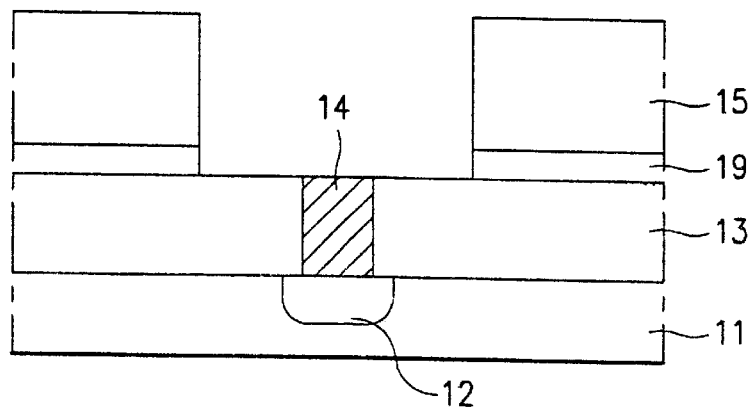

As shown in FIG. 3B, a nitride film 19 and a second interlayer insulating film 15, such as an oxide film, are formed, and a capacitor formation region is defined therein. The nitride film 19 and the second interlayer insulating film 15 in the capacitor formation region are selectively removed. The nitride film 19 and the second interlayer insulating film 15 must be sufficiently thick since the thicknesses are related to a capacitance of the capacitor.

Figure 3C:
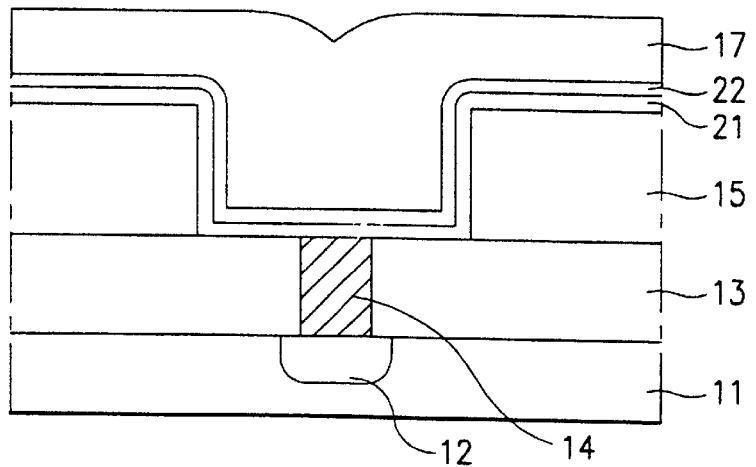

As shown in FIG. 3C, a heavily doped thin amorphous silicon layer 21 with a phosphorus concentration of at least $2.0 \times 10^{20}$ atoms/cm$^3$ is deposited on an entire surface. A lightly doped thin amorphous silicon layer 22 with a phosphorus concentration below $2.0 \times 10^{20}$ atoms/cm$^3$ is deposited thereon. Then, a planarizing insulating film 17, such as an SOG (Silicon On Glass), is deposited on the lightly doped thin amorphous silicon layer 22.

Figure 3D:
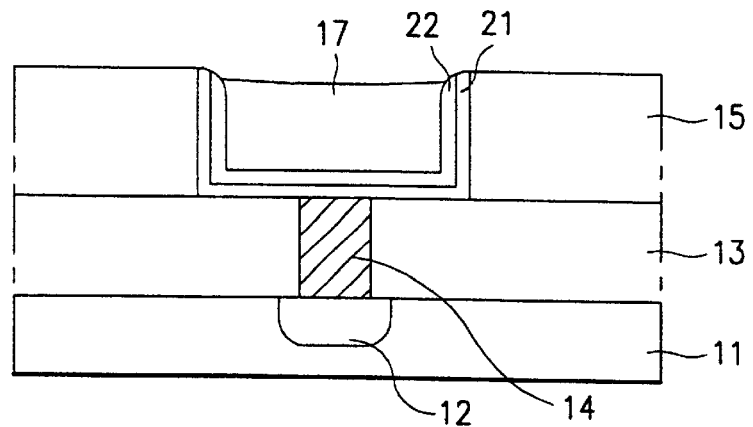
Figure 3E:
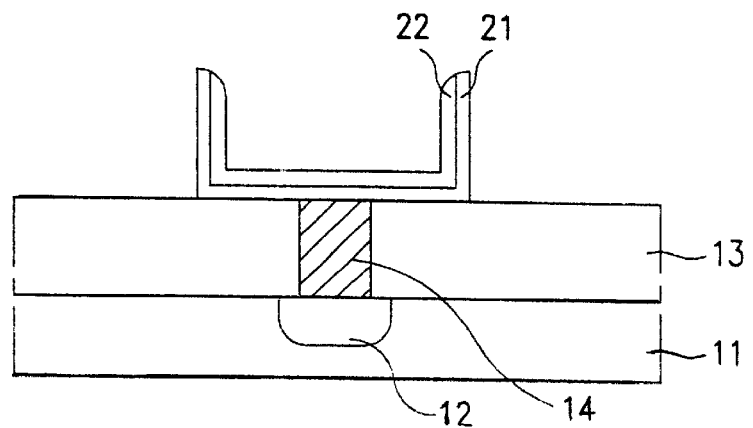

As shown in FIG. 3D, the planarizing insulating film 17, the lightly doped thin amorphous silicon layer 22, and the heavily doped amorphous silicon layer 21 are etched back. As shown in FIG. 3E, all of the planarizing insulating film 17 and the second interlayer insulating film 15 are wet etched, to form a lower electrode of the capacitor.

Figure 3F:
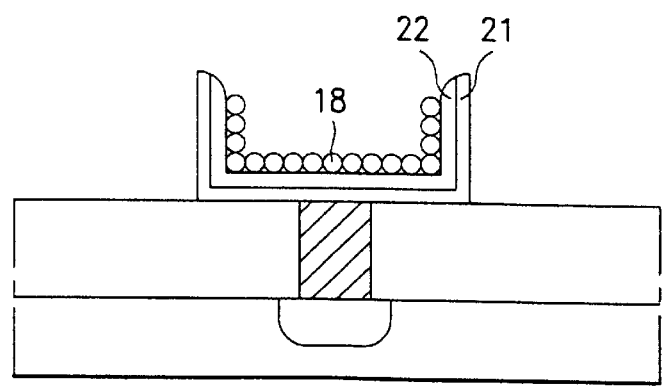

As shown in FIG. 3F, silicon seeds are formed on a surface of the lower electrode at approximately 570–620° C. using a seeding gas ($Si_2H_6$ or $SiH_4$) in an HSG-Si forming apparatus, and then annealed, to form an HSG-Si layer 18 with a rough surface. The HSG-Si layer 18 forms easily on the lightly doped amorphous silicon layer 22 (an inside surface of the lower electrode), while the HSG-Si layer 18 forms poorly on the heavily doped amorphous silicon layer 21 (an outside surface of the lower electrode). Accordingly, the HSG-Si layer 18 formed on the lightly doped amorphous silicon layer 22 (an inside surface of the lower electrode) has large grains, while the HSG-Si layer 18 formed on the heavily doped amorphous silicon layer 21 (an outside surface of the lower electrode) has small grains, thereby preventing bridges because the small grain HSG-Si layer 18 formed on the outside surface is relatively unlikely to fall off. A dielectric film and an upper electrode (not shown) are formed in succession on the lower electrode to complete a capacitor.

A method for fabricating a capacitor in accordance with another embodiment of the present invention will now be explained with reference to FIGS. 4A–4D.

Figure 4A:
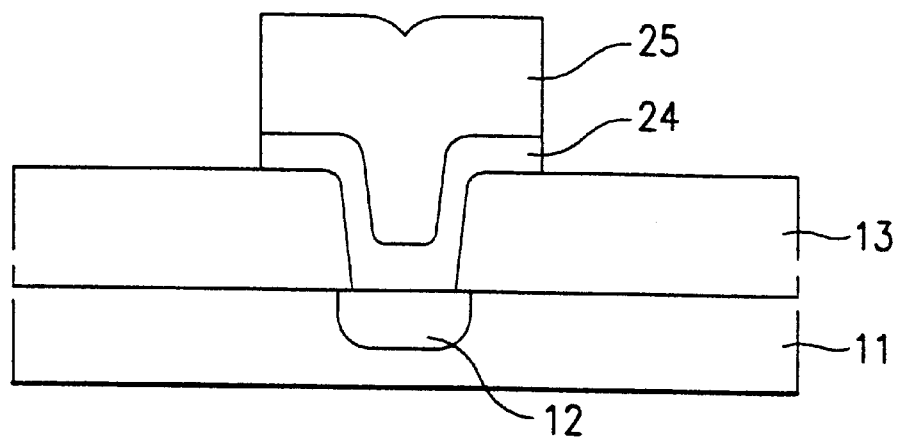
FIGS. 4A–4D illustrate cross-sections showing steps of a method for fabricating a lower electrode of a capacitor in accordance with a third preferred embodiment of the present invention.

Referring to FIG. 4A, a first interlayer insulating film 13 is formed on a semiconductor substrate 11 having an impurity region 12 formed therein, and a portion of the first interlayer insulating film 13 over the impurity region 12 is selectively removed, to form a contact hole for a capacitor. Polysilicon or metal 24 is deposited on an entire surface, and a cap layer 25 of, for example, PSG, is deposited thereon. A capacitor forming region is defined by photolithography, and the cap layer 25, and the polysilicon or metal 24 are selectively removed, thereby remaining only in the capacitor forming region.

Figure 4B:
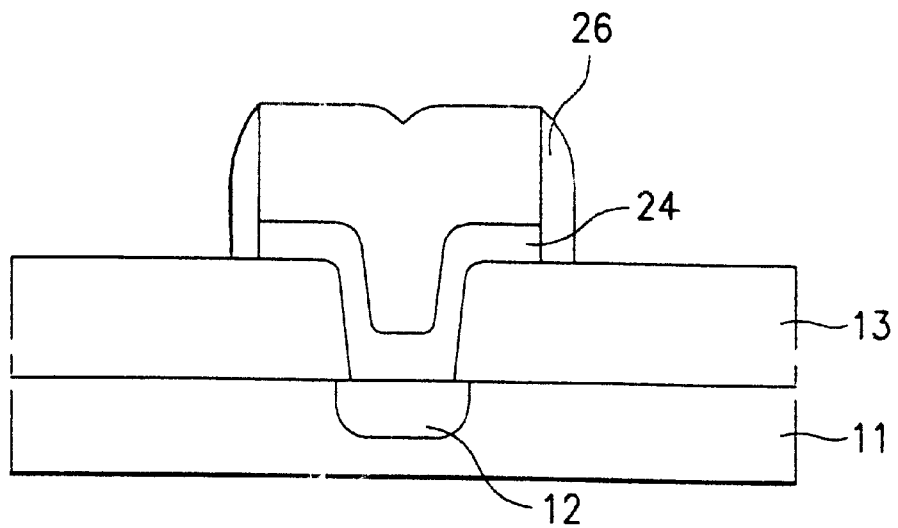

As shown in FIG. 4B, amorphous silicon is deposited on an entire surface of the substrate including the first interlayer insulating film 13 and the cap layer 25, and is anisotropically etched to form amorphous silicon sidewalls 26 at sides of the cap layer 25. The amorphous silicon is then lightly doped with a phosphorus concentration below $2.0 \times 10^{20}$ atom/cm$^3$.

Figure 4C:
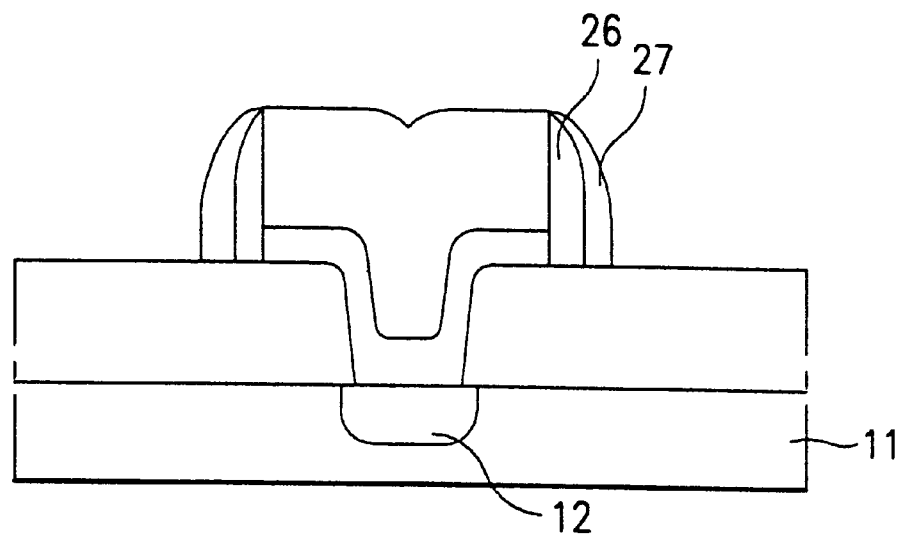

As shown in FIG. 4C, a polysilicon layer is deposited on an entire surface and anisotropically etched to form polysilicon sidewalls 27 at sides of the amorphous silicon sidewalls 26, thereby fabricating a lower electrode of a capacitor having polysilicon or metal 24, amorphous silicon sidewalls 26, and polysilicon sidewalls 27. An amorphous silicon layer heavily doped with a phosphorus concentration over $2.0 \times 10^{20}$ atom/cm$^3$ may also be used instead of the polysilicon.

Figure 4D:
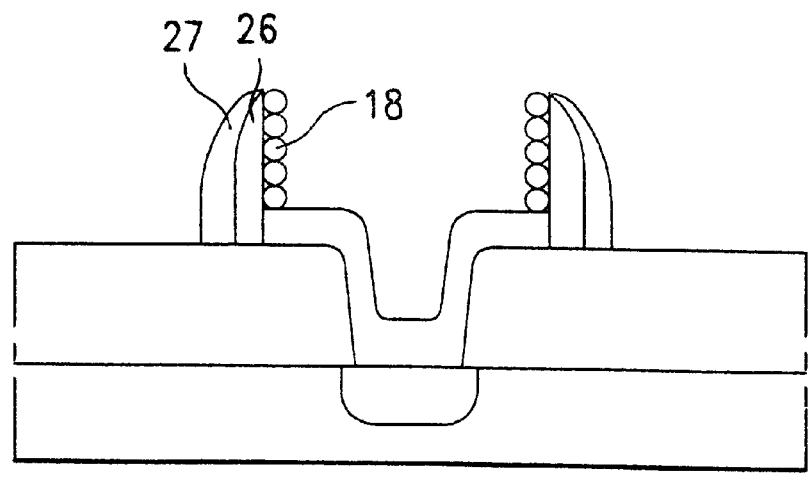

As shown in FIG. 4D, the cap layer 25 is removed entirely, and then silicon seeds are formed on a surface of the lower electrode at approximately 570–620° C. using a seeding gas ($Si_2H_6$ or $SiH_4$) in an HSG-Si forming apparatus, and then annealed to form an HSG-Si layer 18 with a rough surface. The HSG-Si layer 18 forms easily on the lightly doped amorphous silicon layer 26 (an inside surface of the lower electrode), while the HSG-Si layer 18 forms poorly on the polysilicon sidewalls 27 (an outside surface of the lower electrode). A dielectric film and an upper electrode (not shown) are formed in succession on the lower electrode, thereby completing a capacitor.

Figure 5:
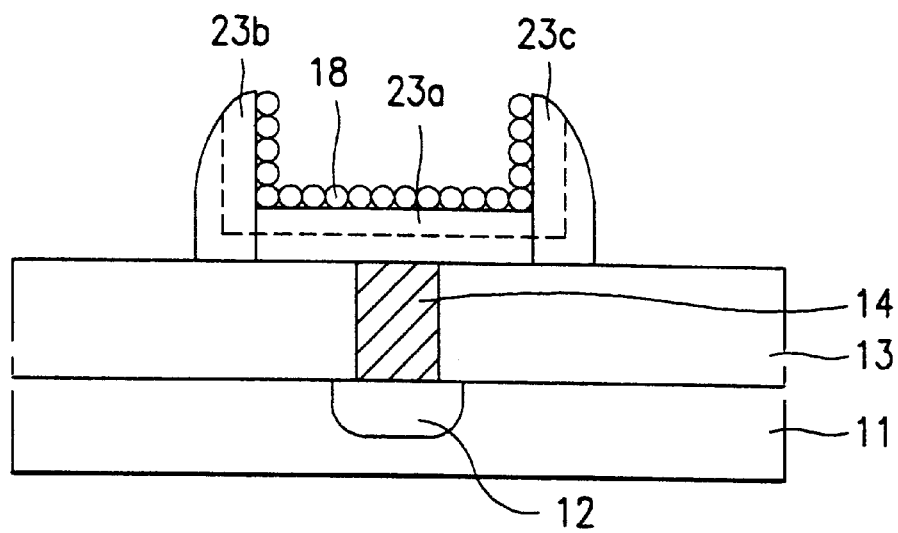
FIG. 5 illustrates a cross-section showing the lower electrode of a capacitor in accordance with the first preferred embodiment of the present invention.
Figure 6:
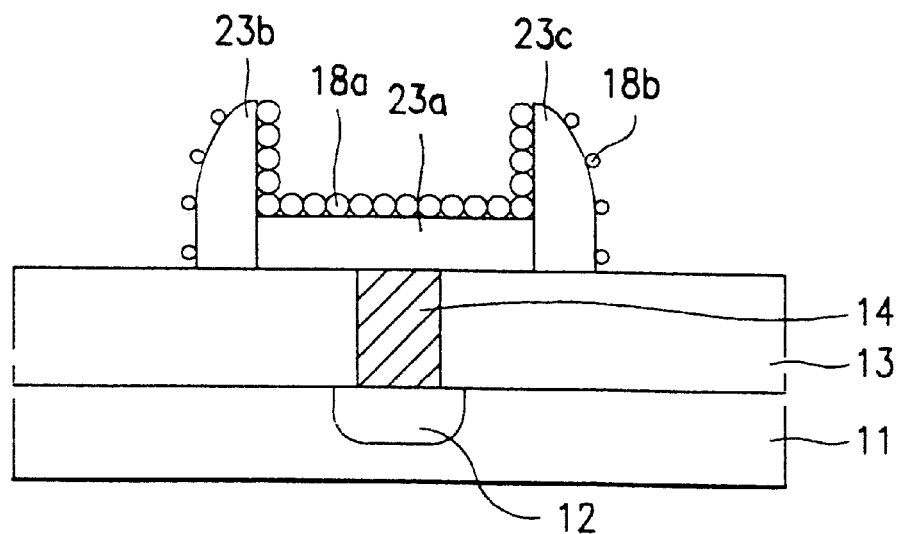
FIG. 6 illustrates a cross-section showing the lower electrode of a capacitor in accordance with the second preferred embodiment of the present invention.

The capacitor of the present invention has a general structure as shown in FIGS. 5–6.

In FIG. 5, the lower electrode of the capacitor in accordance with the first preferred embodiment of the present invention includes the interlayer insulating film 13 formed on the semiconductor substrate 11 having the impurity region 12 formed therein. The interlayer insulating film 13 has the contact hole formed over the impurity region 12. The plug 14 is formed in the contact hole. The first lower electrode 23a is formed on the interlayer insulating film 13 including the plug 14 (and electrically connected to the plug 14), and second lower electrodes 23b and 23c are formed at both sides of the first lower electrode 23a, and electrically connected to, and higher than, the first lower electrode 23a. The HSG-Si layer 18 is formed on a top surface of the first lower electrode 23a and inside the surfaces of the second lower electrodes 23b and 23c.

In FIG. 6, the lower electrode of the capacitor in accordance with the second preferred embodiment of the present invention includes the interlayer insulating film 13 formed on the semiconductor substrate 11 having an impurity region 12 formed therein. The interlayer insulating film 13 has the contact hole formed over the impurity region 12. The plug 14 is formed in the contact hole. The first lower electrode 23a is formed on the interlayer insulating film 13 and the plug 14, and electrically connected to both. The second lower electrodes 23b and 23c are formed at both sides of the first lower electrode 23a, electrically connected to, and higher than, the first lower electrode 23a. The first HSG-Si layer 18a is formed on a top surface of the first lower electrode 23a and inside surfaces of the second lower electrodes 23b and 23c. The second HSG-Si layer 18b, with smaller grains than the first HSG-Si layer 18a, is formed on the outside surfaces of the second lower electrodes 23b and 23c.

The structure of the lower electrode of the capacitor in accordance with the third embodiment of the present invention is similar to the structure of the lower electrode of the capacitor of the first embodiment. Here, as shown in FIGS. 2F and 3F (though not shown in FIGS. 4 and 5), the first lower electrode 23a may be a stack of a polysilicon layer/ amorphous silicon layer, or a stack of a heavily doped amorphous silicon layer/lightly doped amorphous layer The second lower electrode 23b and 23c may be an inside wall of an amorphous silicon layer and an outside wall of a polysilicon layer, or an inside wall of a lightly doped amorphous layer and an outside wall of a heavily doped amorphous silicon layer.

The structure of a lower electrode of a capacitor and the method for fabricating the same of the present invention have a number of advantages. For example, by not forming the HSG-Si layer on an outside wall of a cylindrical lower electrode or by forming the HSG-Si layer on the outside wall with relatively smaller grains than the HSG-Si layer on an inside wall, occurrence of bridges between nodes caused by fall-off of the HSG-Si layer can be prevented, thereby improving yield of DRAMs.

It will be apparent to those skilled in the art that various modifications and variations can be made in the structure of a lower electrode of a capacitor and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A structure of a lower electrode of a capacitor comprising:
   a first lower electrode;
   second lower electrodes formed at both sides of the first lower electrode and electrically connected to and higher than the first lower electrode, the second lower electrodes forming a cylindrical structure having inside and outside walls;
   a first Hemispherical Grain-Silicon (HSG-Si) layer on a top surface of the first lower electrode and the inside walls of the second lower electrodes; and
   a second HSG-Si layer on the outside walls and having smaller silicon grains than the first HSG-Si layer,
   wherein the first and second lower electrodes each includes two layers of semiconductor material having a dissimilar crystalline structure.

2. The structure of claim 1, wherein the first lower electrode is a stack including a polysilicon layer and an amorphous silicon layer.

3. The structure of claim 1, wherein the first lower electrode is a stack including a heavily doped amorphous silicon layer and a lightly doped amorphous silicon layer.

4. The structure of claim 1, wherein each of the second lower electrodes includes an outside wall formed of a polysilicon layer and an inside wall formed of an amorphous silicon layer.

5. The structure of claim 1, wherein each of the second lower electrodes includes an outside wall formed of heavily doped amorphous silicon and an inside wall formed of lightly doped amorphous silicon.

6. The structure of claim 1, wherein only the inside wall of each of the second lower electrodes has grains of HSG-Si attached thereto.

7. A cylindrical lower electrode of a capacitor comprising:
   a first bottom portion in contact with a substrate;
   a second bottom portion on the first bottom portion and having a different crystalline structure than the first bottom portion;
   a cylinder wall having the same material as the second bottom portion on its inner side, and the same material as the first bottom portion on its outer side;
   a first layer of HSG-Si (Hemispherical Grain-Silicon) on the inner side of the cylinder wall and the second bottom portion; and
   a second HSG-Si layer on the outside walls and having smaller silicon grains than the first HSG-Si layer.

8. The structure of claim 7, wherein the first bottom portion includes heavily doped amorphous silicon and the second bottom portion includes lightly doped amorphous silicon.

9. The structure of claim 7, wherein only the inner side of the cylinder wall and the second bottom portion have grains of HSG-Si attached thereto.

10. The structure of claim 7, further including:
    an impurity region in the substrate;
    an insulating layer on the substrate and having a contact hole over the impurity region; and
    a conductive plug filling the contact hole.

11. A cylindrical lower electrode of a capacitor comprising:
    a first bottom portion in contact with a substrate;
    a second bottom portion on the first bottom portion and having different characteristics from the first bottom portion;
    a cylinder wall having the same material as the second bottom portion on its inner side, and the same material as the first bottom portion on its outer side;
    a first layer of HSG-Si (Hemispherical Grain-Silicon) on the inner side of the cylinder wall and the second bottom portion; and
    a second HSG-Si layer on the outside walls and having smaller silicon grains than the first HSG-Si layer,
    wherein the first bottom portion includes polysilicon and the second bottom portion includes amorphous silicon.

12. A cylindrical lower electrode of a capacitor comprising:
    a first bottom portion in contact with a substrate;
    a second bottom portion on the first bottom portion and having different characteristics from the first bottom portion;
    a cylinder wall having the same material as the second bottom portion on its inner side, and the same material as the first bottom portion on its outer side; and
    a first layer of HSG-Si (Hemispherical Grain-Silicon) on the inner side of the cylinder wall and the second bottom portion; and
    a second layer of HSG on an outer side of the cylinder wall and having smaller grains of silicon than the first layer.

13. The structure of claim 12, wherein the first bottom portion includes polysilicon and the second bottom portion includes amorphous silicon.

14. The structure of claim 12, wherein the first bottom portion includes heavily doped amorphous silicon and the second bottom portion includes lightly doped amorphous silicon.

15. The structure of claim 12, further including:
    an impurity region in the substrate;
    an insulating layer on the substrate and having a contact hole over the impurity region; and
    a conductive plug filling the contact hole.

* * * * *